(12) United States Patent
Vusirikala

(10) Patent No.: US 6,859,468 B2
(45) Date of Patent: Feb. 22, 2005

(54) METHOD AND SYSTEM FOR MODE STABILIZATION OF VCSELS USING INCREASED BIAS CURRENT

(75) Inventor: Vijayanand Vusirikala, Westford, MA (US)

(73) Assignee: Sycamore Networks, Inc., Chelmsford, MA (US)

( * ) Notice: Subject to any disclaimer, the term of this patent is extended or adjusted under 35 U.S.C. 154(b) by 178 days.

(21) Appl. No.: 09/867,865

(22) Filed: May 29, 2001

(65) Prior Publication Data

US 2002/0181524 A1 Dec. 5, 2002

(51) Int. Cl.$^7$ ................................................. H01S 3/13
(52) U.S. Cl. .................................................. 372/29.02
(58) Field of Search ............................... 372/43–50, 96, 372/29.01–33, 38.1–38.09, 8; 257/94; 359/180

(56) References Cited

U.S. PATENT DOCUMENTS

| | | | |
|---|---|---|---|
| 5,175,641 A | * 12/1992 | Boerstler et al. | ........... 359/180 |
| 5,287,366 A | * 2/1994 | Epworth et al. | ............... 372/26 |
| 5,359,447 A | 10/1994 | Hahn et al. | ................. 359/154 |
| 5,577,064 A | 11/1996 | Swirhun et al. | .............. 372/96 |
| 5,712,865 A | 1/1998 | Chow et al. | ................... 372/96 |
| 5,748,653 A | * 5/1998 | Parker et al. | ................... 372/8 |
| 5,757,836 A | * 5/1998 | Jiang et al. | .................... 372/50 |
| 6,021,147 A | 2/2000 | Jiang et al. | .................... 372/46 |
| 6,040,590 A | * 3/2000 | O'Brien et al. | ................ 257/94 |
| 6,144,682 A | 11/2000 | Sun | .............................. 372/45 |

* cited by examiner

*Primary Examiner*—Quyen Leung
(74) *Attorney, Agent, or Firm*—Lahive & Cockfield, LLP

(57) ABSTRACT

The present invention discloses a vertical cavity surface emitting laser (VCSEL). The VCSEL comprises a first and second mirror stack. The VCSEL has an active region positioned between the first mirror stack and second mirror stack. Also, the VCSEL has a contact region in at least one of the active regions. The VCSEL encompasses a module for stabilizing the gains among a plurality of modes included by spatial power instability by increasing the current through the contact.

22 Claims, 5 Drawing Sheets

Figure 1 Eye diagram of showing significant eye closure for degraded VCSELs

Figure 1 Eye diagram showing relatively open eye for stable VCSELs

METHOD AND SYSTEM FOR MODE STABILIZATION OF VCSELS USING INCREASED BIAS CURRENT

FIELD OF THE INVENTION

The present invention relates generally to stabilizing modes in a Vertical Cavity Surface Emitting Laser (VCSEL), and specifically relates to mode stabilization through the increasing of bias current to the VCSEL.

BACKGROUND OF THE INVENTION

Semiconductor lasers are in widespread use for technologies such as a light source for communication systems, compact disc players, and so forth. Recently, a new type of laser device the VCSEL has been introduced. The advantages of the VCSEL are that it is smaller, has potentially higher performance, and is more manufacturable. These benefits are due in part from advances in epitaxial deposition techniques, such as metal organic chemical vapor deposition (MOCVD) and molecular beam epitaxy (MBE). Other benefits of VCSELS include geometry, amenability to one-and-two dimensional arrays, wafer-level qualifications and desirable beam characteristics.

VCSELs are designed to have an active region with one or more quantum well layers. The sides of the active region are mirror stacks which are typically formed by interleaved semiconductor layers having properties that require each layer to be a quarter of a wavelength thick. The mirrors in the mirror stacks act as the mirrors of the laser cavity. Opposite conductivity type regions are positioned on opposite sides of the active region. The laser either can be turned "on" and "off" by changing the current through the active region.

VCSELs are useful for applications using fast, medium distance or multi-channel data link applications. VCSELs are also useful for numerous optical and/or imaging applications. The geometry of the VCSELs enable the VCSELs to serve as low cost high performance transmitters with flexible and desirable characteristics.

A problem with multimode lasers is the mode competition induced by spatial and spectral power instability. In many cases, the modal instability is exhibited after an initial burn-in or after a few months of regular operations. Thus, this poses a severe problem for commercial use of VCSELs. The instability leads to different modes seeing different gains, which in turn results in different speeds for the respective modes. Various methods to address the problem have been devised. These methods include (a) increasing the number of modes, (b) performing mode discrimination, and (c) using "peaking circuits".

The use of a very large number of modes can cause some problems associated with coupling the light from the VCSEL to the multi-mode fiber, and hence, can complicate the design of the coupling optics. The complication stems from the different modes having different divergence angles. As a result, collecting light from all the modes requires a complicated lens design.

The mode discrimination approach also has drawbacks. The mode discrimination approach requires very tight tolerances during manufacturing and packaging. In addition, by suppressing some modes and enhancing other modes in this approach, the overall coupled power to the fiber is significantly reduced. In addition, this approach is very dependent on the exact VCSEL design and structure that is chosen. Hence, this approach cannot easily be applied to a wide variety of VCSEL designs.

Electronic peaking has disadvantages as well. This approach requires additional components on the circuit board. Also, electronic peaking cannot work universally for all VCSELs because dynamic characteristics generally differ from device to device. Thus, this approach was using precious board real estate, and adds cost.

Therefore, there is a need for an alternative system and method of mode stabilization that does not have the drawbacks discussed above relative to conventional solutions.

SUMMARY OF THE INVENTION

The present invention addresses the above-described limitations of conventional VCSELs. The present invention provides an alternative method in which mode stabilization can be achieved by increasing the bias current. This present invention is simple and easy to implement and major design changes to the VCSELs are not required.

In one embodiment of the present invention discloses a vertical cavity surface emitting laser (VCSEL). The VCSEL comprises a first and second mirror stack. The VCSEL has an active region positioned between the first mirror stack and second mirror stack. Also, the VCSEL has a contact region in at least one of the active regions. The VCSEL encompasses a stabilizer module for stabilizing the gains among a plurality of modes included by spatial power instability by increasing the current through the contact.

In another embodiment of the present invention discloses a vertical cavity surface emitting laser used in a multi-channel system. The VCSEL comprises a first and second mirror stack. The VCSEL has an active region positioned between the first mirror stack and second mirror stack. Also, the VCSEL has a contact region in at least one side of the active region providing current to be distributed through the active region. The VCSEL encompasses a stabilizer module for stabilizing the gains among a plurality of modes included by spatial power instability by increasing the current through the contact.

In another embodiment of the present invention discloses a stabilizer module for stabilizing a VCSEL. The stabilizer module comprises a power for measuring spatial and spectral power of the VCSEL. Also, the stabilizer module further comprises a determination module for determining whether the spatial and spectral power of the VCSEL is unstable because of modal gains. Further, the stabilizer module includes a current module for increasing bias current to a level where the VCSEL is stable if it is determined that the VCSEL is not stable.

BRIEF DESCRIPTION OF THE DRAWINGS

FIG. 4 illustrates an eye diagram showing the instability of a VCSEL after burn-in.

DETAILED DESCRIPTION OF THE INVENTION

The illustrative embodiment of the present invention provides a method and system in which mode stabilization can be achieved by increasing the bias current. The illustrative embodiment employs an approach that can be used with multiple VCSEL designs and can be applied without physically modifying the VCSELs. There is no need in the illustrative embodiment for added electronics that increase costs and take up precious board space.

Figure 1:
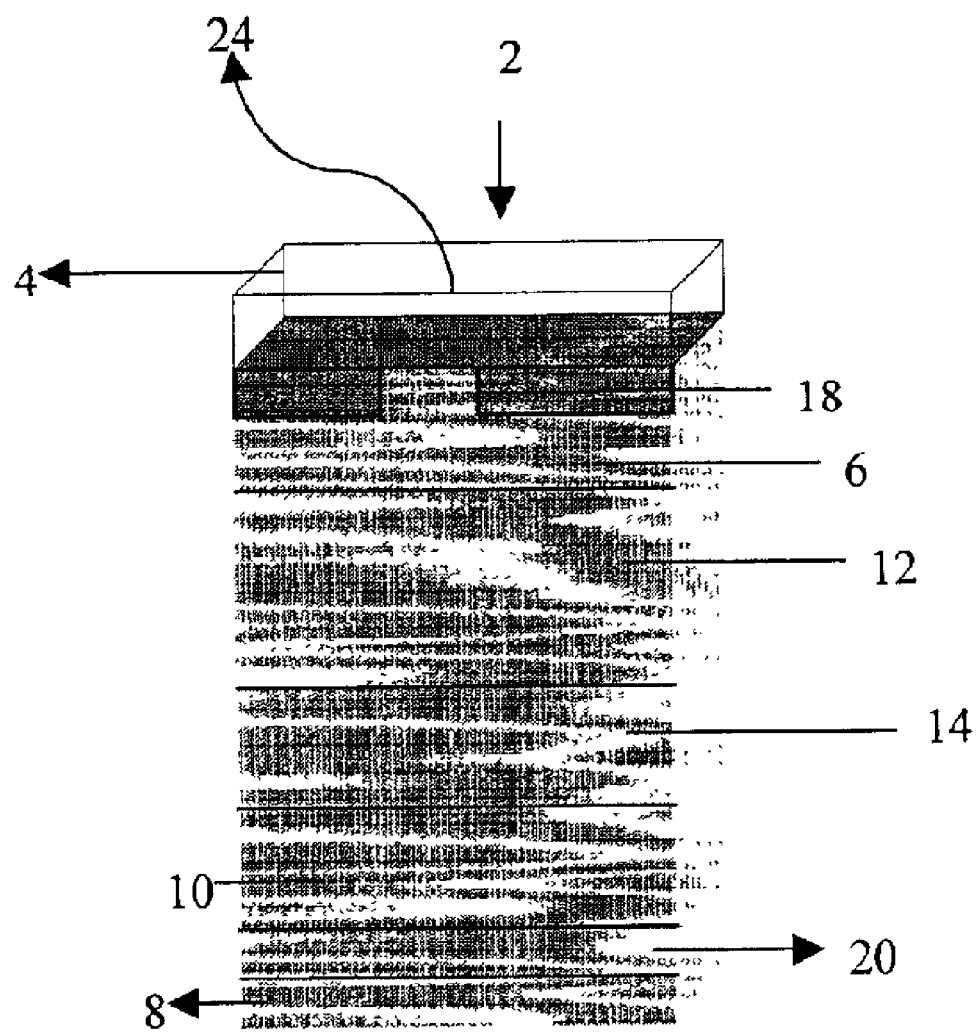
FIG. 1 illustrates a VCSEL for use in an illustrative embodiment of the present invention.

FIG. 1 depicts a VCSEL in accordance with the illustrative embodiment of the present invention. The VCSEL 2 has a first electrode 4 disposed on top of a first mirror stack 6, a second electrode 8 disposed on a semiconductor substrate 10 beneath an active region 12 and a second mirror stack 14. The active region 12 is formed of a conventional multiple quantum well and is contacted on opposing sides by electrodes 4 and 8. The first mirror stack 6 defines a waveguide cavity which constrains the electromagnetic field and defines the traverse optical mode. The axial mode of the electromagnetic field and defines by spacing of the reflective surfaces of the respective mirror stacks 6 and 14 and the thickness of the active region 12, the first contacting layer 18 and second contacting layer 20. The active region 12 is positioned at the maximum in the axial mode's standing wave pattern, as is understood in the art. The first contacting layer 18 is positioned above the active layer 12 in electrical contact through the first mirror stack 6 with the first electrode 4, and a second contacting layer 20 is disposed below the active region in electrical contact through the second mirror stack 14 with the second electrode 8. For laser operations under an electrical excitation, it is required that one of the contacting layers be p-type and the other be n-type, as is understood in the art. The electrical-insulating slot 24 may be formed by a selective technique, such as wet etching or wet oxidizing a high aluminum containing semiconductor layer, as is known in the art. The high aluminum containing layer, such as, AlGaAs, AlnP or the like, is grown within the first contacting layer 18 and exposed by etching a mesa after epitaxial growth.

Figure 2:
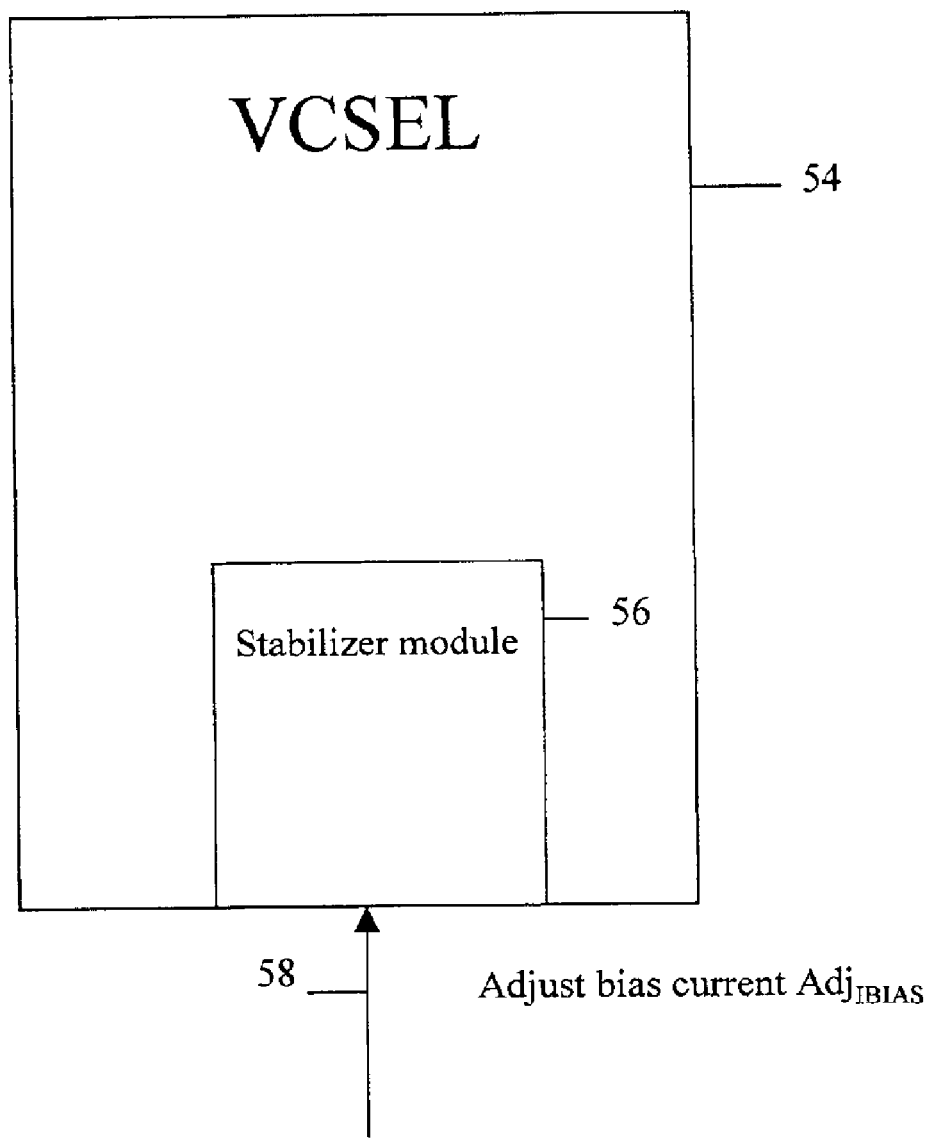
FIG. 2 illustrates a more detailed depiction of the present invention.

FIG. 2 illustrates a more detail depiction of the present invention. As shown, VCSEL 54 includes a stabilizer module 56. The stabilizer module 56 manages the amount of adjusted bias current $Adj_{BIAS}$ 58 that is used by the VCSEL. VCSEL 54 is allowed to vary its bias current to accommodate changes in its operating characteristics as discussed above. The stabilizer module 56 allows the maximum amount of adjust bias current $Adj_{BIAS}$ 58 that will not saturate the VCSEL 54. Saturation levels vary among VCSELs.

The present invention addresses the issue of modal stability by increasing the bias current to a VCSEL. Bias current has a direct relationship with power emitted from a VCSEL, and bias currently is directed related to the modes created in the VCSEL. In addition, bias current is an operating characteristic which can be used to stabilize the spatial and spectral power and gains as seen by the various modes in a VCSEL. For example, changes in temperature could alter gains viewed by modes and the spatial and spectral power, which leads to mode instability in VCSELs. However, increasing the bias current compensates for changes due in part to temperature or other operating characteristics of the VCSEL because of the relationship of the bias current to power and modal gains in the VCSEL. Adjusting bias current as described herein produces modal stability. The illustrative technique of mode stabilization can be applied almost universally to all oxide confined VCSEL designs. The technique's simple and easy approach can be implemented without necessitating major design changes.

Figure 3:
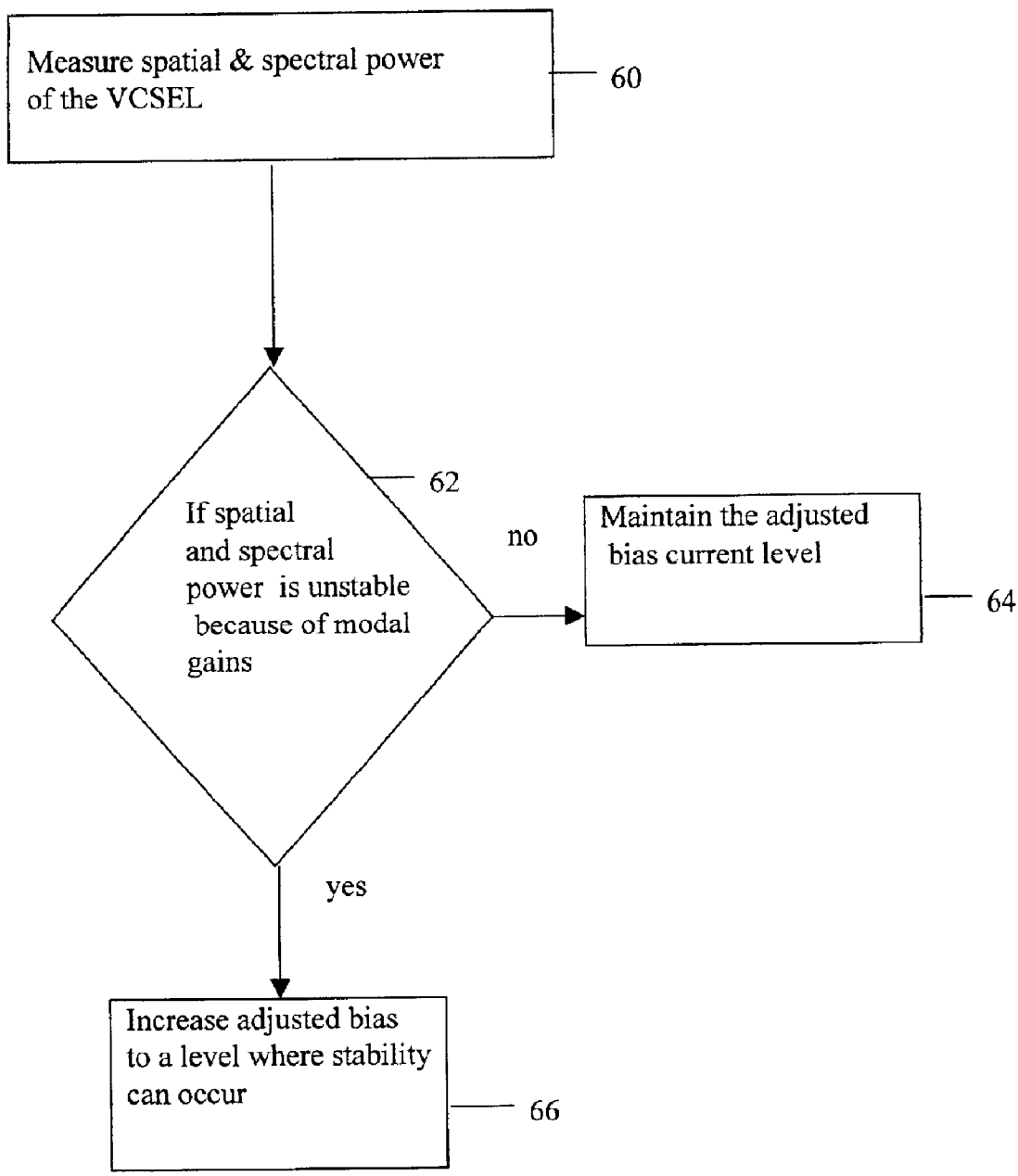
FIG. 3 illustrates the steps needed to determine the appropriate bias current.

FIG. 3 illustrates the steps employed in the illustrative embodiment to determine the appropriate bias current. The stabilizer module 56 measures the spatial and spectral power of the VCSEL in step 60 and checks whether the VCSEL 54 is experiencing spatial or spectral power instability based in part by modal gains in step 62. As shown in step 64, if the VCSEL 54 is not experiencing any spectral or spatial power instability, the stabilizer module 56 will not increase the adjusted bias current $Adj_{BIAS}$. However, if the VCSEL 54 is experiencing spectral or spatial power instability, the stabilizer module increases the adjusted bias current $Adj_{BIAS}$ to the appropriate level needed to stabilize the modal gains. Note that the VCSEL 54 increases the adjusted bias current $Adj_{BIAS}$ to the level where the VSCEL does not saturate.

Figure 4:
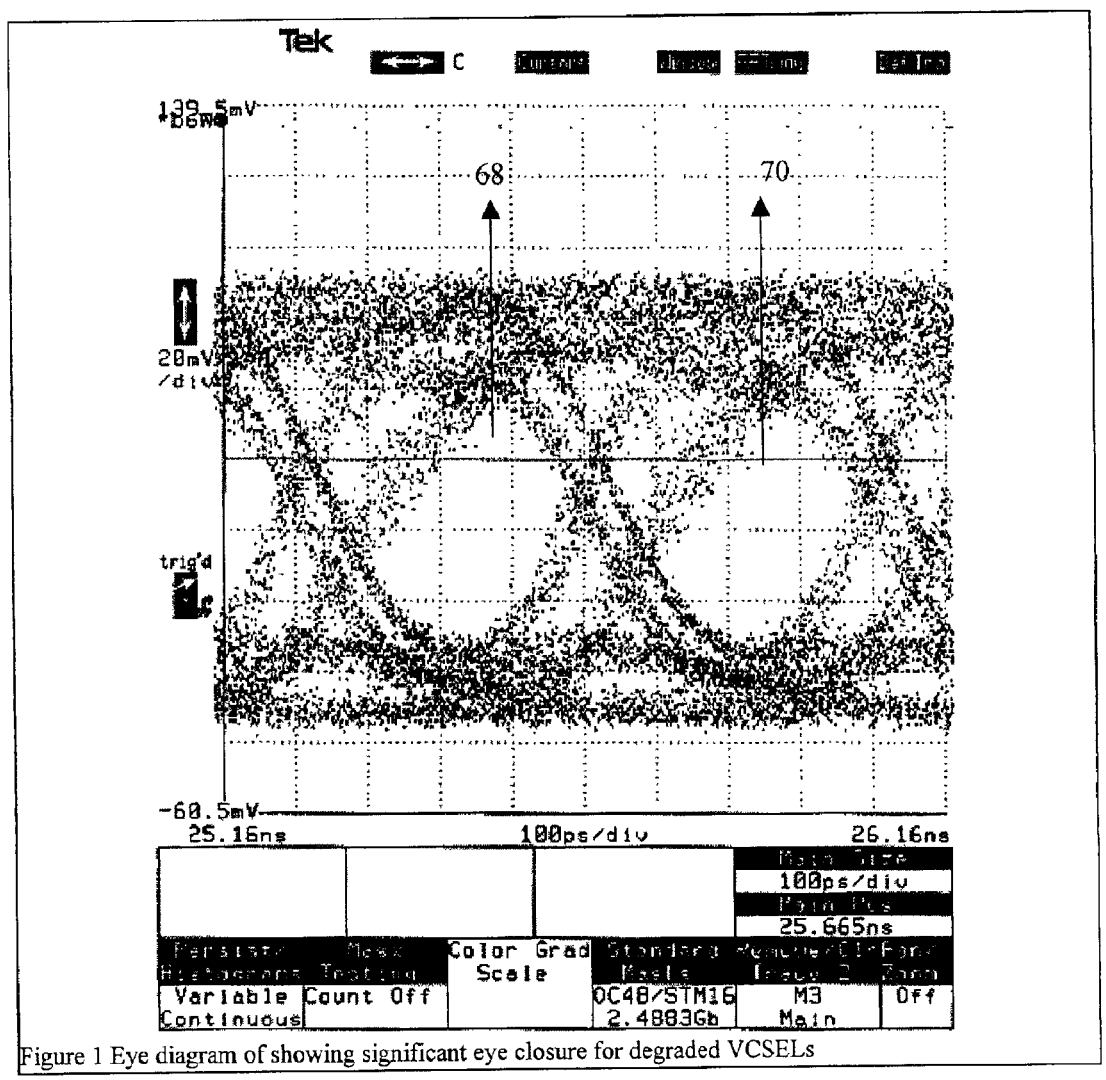

FIG. 4 illustrates the instability of a VCSEL after burn-in. The eye diagram is a diagram produced on a standard oscilloscope when a signal is used as vertical input of the oscilloscope. In each binary signal, the eye diagram either has an eye open or closed based in part by degradation in the signal. As shown in FIG. 4, the spectral power diagram shows that the instability lends to the closure of the optical eyes 68, 70. This is based on the modes seeing different gains leading to different speeds. FIG. 4 demonstrates the instability of VCSEL devices where there is no even distribution of power and gains among the various modes. Instability of this sort can lead to incorrect outputs from VCSELs. Especially, in applications requiring 1.25–2.5 Gb/s bandwidth wherein modal instability can be quite devastating.

Figure 5:
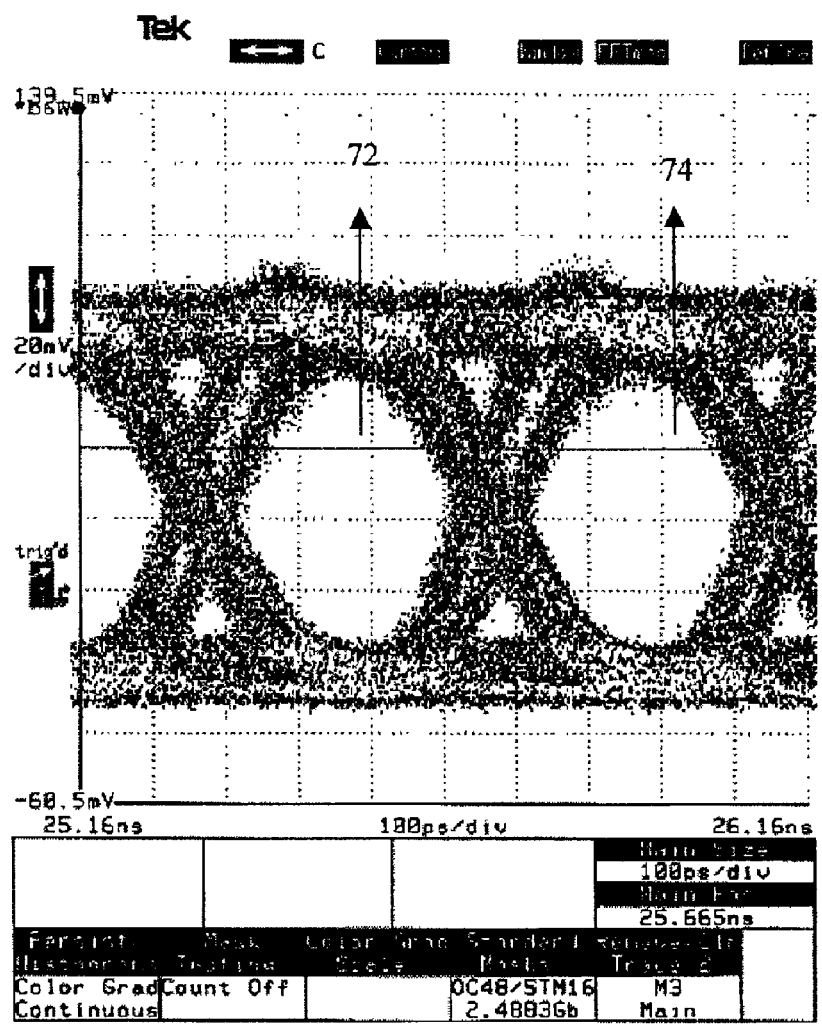
FIG. 5 illustrates an eye diagram showing the mode stabilization in the VCSEL in accordance with the illustrative embodiment.

FIG. 5 illustrates the inventive concept of stabilizing the modes in the VCSELs. As shown, there is an improvement in the spatial and spectral power distribution among the modes. There is less closure of the optical eyes 72 and 74 which demonstrates stability among the various modes seeing sufficient gains and lending to different speeds. This technique of stabilizing the modes was shown to be stable even after the initial burn-in and accelerated life test, making the innovation attractive for commercial use. This approach can be applied to almost all oxide confined VCSEL designs. Also, the approach is simple and easy to implement on the manufacturing line without necessitating major design changes. The mode stability eliminates the need for expensive and time consuming "burn-in" of the modules.

Numerous modifications and alternative embodiments of the invention will be apparent to those skilled in the art in view of the foregoing description. Accordingly, this description illustrative only and is for the purpose of teaching those skilled in the art the best mode for carrying out the invention. Details of the structure may vary substantially without departing from the spirit of the invention, and exclusive use of all modifications that come within the scope of the appended claims is reserved. It is intended that the invention be limited only to the extent required by the appended claims and the applicable rules of law.

Having described the invention, what is claimed as new and protected by Letters Patent is

What is claimed:

1. A vertical cavity surface emitting laser (VCSEL) comprising:

an active region;

a contact region in at least one side of the active region providing current to be distributed through the active region; and a stabilizer module for stabilizing modal gains of multiple modes of the VCSEL by increasing the current through the contact region.

2. The VCSEL as recited in claim 1 wherein the VCSEL is an oxide VCSEL.

3. The VCSEL as recited in claim 1 wherein the VCSEL is adapted to position in high-speed communication links over a multimode fiber.

4. A vertical cavity surface emitting laser (VCSEL) used in a multi-channel system, the VCSEL comprising:
   an active region;
   a contact region in at least one side of the active region providing current to be distributed through the active region; and
   a stabilizer module for stabilizing modal gains of multiple modes of the VCSEL by increasing the current through the contact region.

5. The VCSEL as recited in claim 4 wherein the VCSEL is an oxide VCSEL.

6. The VCSEL as recited in claim 4 wherein the VCSEL is adapted to position in high-speed communication links over a multimode fiber.

7. A method for stabilizing modes in VCSEL, said method comprising:
   generating a plurality of modes within said VCSEL;
   determining whether the modes in the VCSEL are unstable based on changes in operating characteristics of the VCSEL;
   generating an adjustable bias current for stabilizing the modes in the VCSEL; and
   adjusting bias current of the VCSEL to stabilize the modes to compensate for the changes in the operating characteristics.

8. The method as recited in claim 7 wherein the VCSEL is an oxide VCSEL.

9. The method as recited in claim 7 wherein the step of adjusting bias current further comprises adjusting bias current up to a saturation level of the VCSEL.

10. The method as recited in claim 7 wherein the VCSEL is adapted to position in high-speed communication links over a multimode fiber.

11. A system for stabilizing modes in a VCSEL, said system comprises:
    a first module in communication with a VCSEL, wherein said first module is used for determining whether the modes in the VCSEL are unstable based on changes of the operating characteristics; and
    a second module in communication with a VCSEL, wherein said second module is used for adjusting bias current of the VCSEL to stabilize the modes to compensate for the changes in the operating characteristics.

12. The system as recited in claim 11 wherein the VCSEL is an oxide VCSEL.

13. The system as recited in claim 11 wherein the bias current is adjusted up to the saturation level of the VCSEL.

14. The system L as recited in claim 11 wherein the VCSEL is adapted to position in applications of 1.2 Gb/s and 2.5 Gb/s frequencies.

15. The system as recited in claim 11 wherein the VCSEL is adapted to position in high-speed communication links over a multimode fiber.

16. A stabilizer module in communication with a VCSEL, the stabilizer module comprising:
    a power module for measuring spatial and spectral power of the VCSEL;
    a determination module for determining whether the spatial and spectral power of the VCSEL is unstable because of modal gains; and
    a current module for increasing bias current to a level where the VCSEL is stable if it is determined that the VCSEL is not stable.

17. The stabilizer module as recited in claim 16 wherein the VCSEL is an oxide VCSEL.

18. The stabilizer module as recited in claim 16 wherein the current module adjusts bias current up to the saturation level of the VCSEL.

19. The stabilizer module as recited in claim 16 wherein the VCSEL is adapted to position in applications of 1.2 Gb/s and 2.5 Gb/s frequencies.

20. The stabilizer module as recited in claim 16 wherein the VCSEL is adapted to position in high-speed communication links over a multimode fiber.

21. The VCSEL in accordance with claim 1, wherein said active region is defined by a plurality of mirror stacks.

22. The VCSEL as recited in claim 1 wherein instability of the modal gains is induced by spatial power instability in the active region.

* * * * *